US011723151B2

(12) United States Patent
Shangguan et al.

(10) Patent No.: US 11,723,151 B2
(45) Date of Patent: *Aug. 8, 2023

(54) METHODS OF CREATING EXPOSED CAVITIES IN MOLDED ELECTRONIC DEVICES

(71) Applicant: FLEX LTD, Singapore (SG)

(72) Inventors: Dongkai Shangguan, San Jose, CA (US); David Geiger, Dublin, CA (US); Venkat Iyer, Cupertino, CA (US); Cheng Yang, Pudong New Area (CN)

(73) Assignee: FLEX LTD, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/719,348

(22) Filed: Apr. 12, 2022

(65) Prior Publication Data

US 2022/0330435 A1 Oct. 13, 2022

Related U.S. Application Data

(63) Continuation of application No. 16/709,743, filed on Dec. 10, 2019, now Pat. No. 11,304,302.

(30) Foreign Application Priority Data

Sep. 26, 2019 (CN) ........................ 201910919566.7

(51) Int. Cl.
*H05K 3/00* (2006.01)
*H05K 3/28* (2006.01)

(52) U.S. Cl.
CPC ......... *H05K 3/0044* (2013.01); *H05K 3/0026* (2013.01); *H05K 3/284* (2013.01); *H05K 2203/025* (2013.01)

(58) Field of Classification Search
CPC .... H05K 3/0044; H05K 3/0026; H05K 3/284; H05K 2203/025; H05K 5/065; H05K 2201/10151; H05K 2203/0228; H05K 2203/1316; Y10T 29/49146; Y10T 29/49789
USPC .................................................... 29/841, 412
See application file for complete search history.

(56) References Cited

U.S. PATENT DOCUMENTS 5,903,125 A * 5/1999 Prentice ................. G05B 19/39 318/625
6,276,355 B1 8/2001 Zhang et al.
6,660,562 B2 12/2003 Lee
6,965,160 B2 11/2005 Cobbley et al.
6,995,462 B2 * 2/2006 Bolken ................... H01L 23/10 257/680
7,199,438 B2 4/2007 Appelt et al.
7,796,187 B2 9/2010 Shangguan et al.
7,858,446 B2 12/2010 Huang et al.
8,334,583 B2 12/2012 Low et al.
9,147,637 B2 9/2015 Otremba et al.
9,337,062 B2 5/2016 Iijima
(Continued)

*Primary Examiner* — Donghai D Nguyen
(74) *Attorney, Agent, or Firm* — Weber Rosselli & Cannon LLP

(57) ABSTRACT

Methods include receiving at least one electronic device including a sensor or an emitter, placing a cover over the sensor or emitter, placing the electronic device, including the cover, into a transfer mold system, encapsulating the electronic device with charge material, and removing a portion of the encapsulating charge material and the cover to expose the sensor or emitter to the environment.

20 Claims, 4 Drawing Sheets

(56) References Cited

U.S. PATENT DOCUMENTS

| | | | |
|---|---|---|---|
| 9,721,922 | B2 | 8/2017 | Marimuthu et al. |
| 10,564,679 | B2 | 2/2020 | Hong et al. |

* cited by examiner

METHODS OF CREATING EXPOSED CAVITIES IN MOLDED ELECTRONIC DEVICES

CROSS-REFERENCE TO RELATED APPLICATIONS

This application is a continuation of U.S. patent application Ser. No. 16/709,743 filed Dec. 10, 2019, now U.S. Pat. No. 11,304,302, which claims benefit of and priority to Chinese Patent Application Serial No. 201910919566.7 filed Sep. 26, 2019, the disclosures of each of the above-identified applications are hereby incorporated by reference in their entirety.

TECHNICAL FIELD

The disclosure relates to methods of exposing cavities in molded electronic devices, and particularly to methods for enabling the use of sensors and signal emitting devices in transfer molded electronics.

BACKGROUND

Transfer molding and compression molding are common techniques for encapsulating electronic components, for example, printed circuit boards having numerous components connected thereto. In transfer molding a charge material, typically a form of thermoset plastic, though other materials may also be employed, is first placed in a transfer pot or chamber. The charge material is heated or otherwise maintained at a viscosity allowing the charge material to flow. The electronic components to be encapsulated are placed into cavities formed in a mold. The transfer pot and the mold cavities are connected by a runner, and a runner gate may be placed at the entrance of the mold cavity. Application of pressure to the transfer pot, usually via a hydraulic press, forces the charge material from the transfer pot through the runner and into the mold cavities. The mold is typically a two-part mold and the dimensions of the mold cavity are defined by both parts and thus define the size and geometry of the final encapsulated electronic component.

Once the charge material has cooled, the electronic components, which may otherwise be quite fragile, are thoroughly encapsulated in the now solidified charge material as shown in FIG. 1. Such encapsulation increases the strength and toughness of electronic circuit boards and other components and helps to expand their life cycle by preventing exposure of the components on the printed circuit board and the printed circuit board itself to the environment.

Though transfer molding of electronic components is a useful tool, there are always needs for improving the technology as the applications of electronic components continues to expand.

SUMMARY

One aspect of the disclosure is directed to a method of enabling the use of sensors and emitters in encapsulated electronic devices.

A method of the disclosure includes receiving at least one electronic device including a sensor or an emitter, placing a cover over the sensor or emitter, placing the electronic device, including the cover, into a transfer mold system, encapsulating the electronic device with charge material, and removing a portion of the encapsulating charge material and the cover to expose the sensor or emitter to the environment.

The electronic device may include a printed circuit board, and the cover may be soldered or attached with adhesives such as epoxy to the printed circuit board prior to encapsulation.

The method may include grinding an entire surface of the encapsulated electronic device to remove a portion of the encapsulating charge material and cover. The surface being ground may be a surface of the encapsulated electronic device opposite a printed circuit board. The grinding may be performed with the electronic device inverted or turned upside down, such that the gravitational force causes the grinding debris to fall away from a surface of the sensor or emitter.

The method may also include milling or laser drilling or other methods of accessing the encapsulated electronic device at known locations of the sensor or emitter to expose the sensor or emitter to the environment. Vacuuming can be employed to remove milling debris from a surface of the emitter or sensor. Milling may also include registering the location of the sensor or emitter with a coordinate system of a milling machine.

In accordance with the disclosure, the cover may be placed on a printed circuit board to cover the sensor or emitter. The cover may be adhered to the printed circuit board. Additionally, or alternatively, the cover may be placed on the sensor or emitter without extending to or touching a printed circuit board.

The method may include singulating the encapsulated electronic device from a plurality of encapsulated electronic devices as well as grinding away flash material from the encapsulated electronic device.

BRIEF DESCRIPTION OF THE DRAWINGS

Objects and features of the disclosed systems and methods will become apparent to those of ordinary skill in the art when descriptions of various embodiments are read with reference to the accompanying drawings, of which.

DETAILED DESCRIPTION

The disclosure is directed to a method of enabling sensors and emitters (e.g., LEDs and other light sources) to be incorporated into encapsulated electronic devices. As will be readily appreciated, using current technology the transfer molding process results in the sensors or emitters being buried under a layer of thermoset material and unable to perform their intended function. In part this is due to these components having relatively small sizes as compared to other components placed on a printed circuit board for encapsulation. Though there is at least one technology that can enable the encapsulation of sensors into such encapsulated electronic devices—the so-called film-assisted molding process, this process requires specialized machinery and equipment and is not suitable for many applications where the manufacture of a fewer number of electronic devices is desired. In addition, the technology has some limitations in terms of shape and depth of the exposed area enabling the sensors and emitters to function.

In accordance with the disclosure, prior to transfer molding of an electronic device a variety of covers may be placed over the sensors or emitters. Then following transfer molding and encapsulation of the electronic device, the entirety of the encapsulated electronic device is ground back to a point where a top surface of the cover is removed, exposing the sensor or emitter housed therein to the environment. Further details of this process are described herein below.

Figure 1:
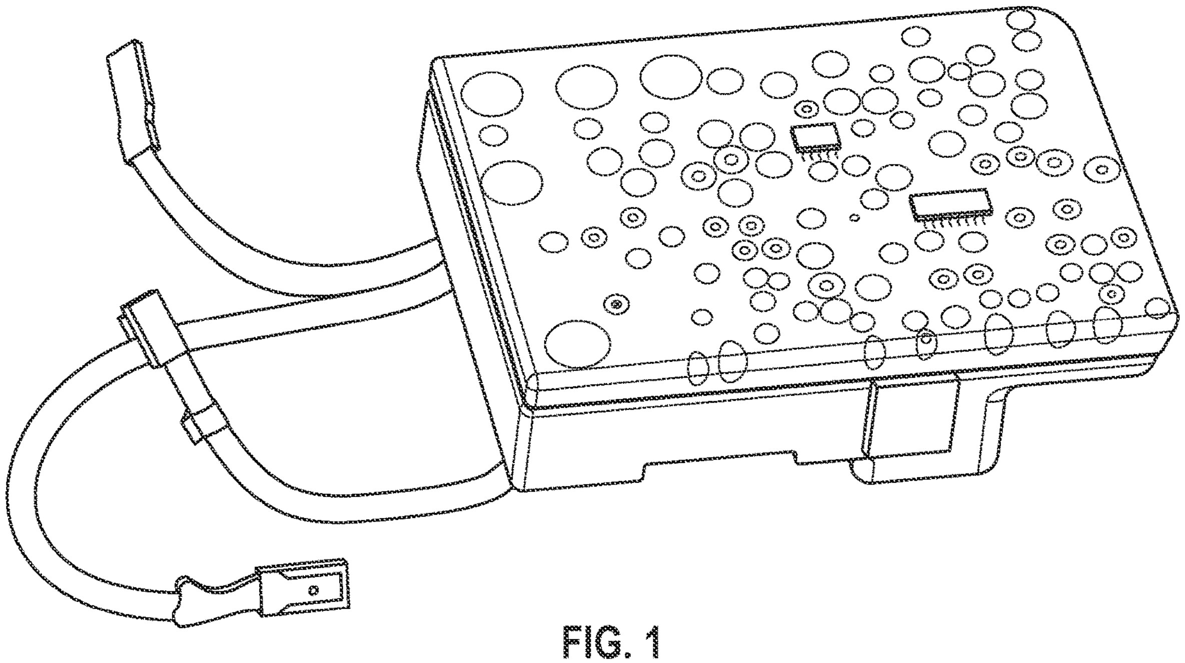
FIG. 1 is a perspective view of an encapsulated electronic device.
Figure 2:
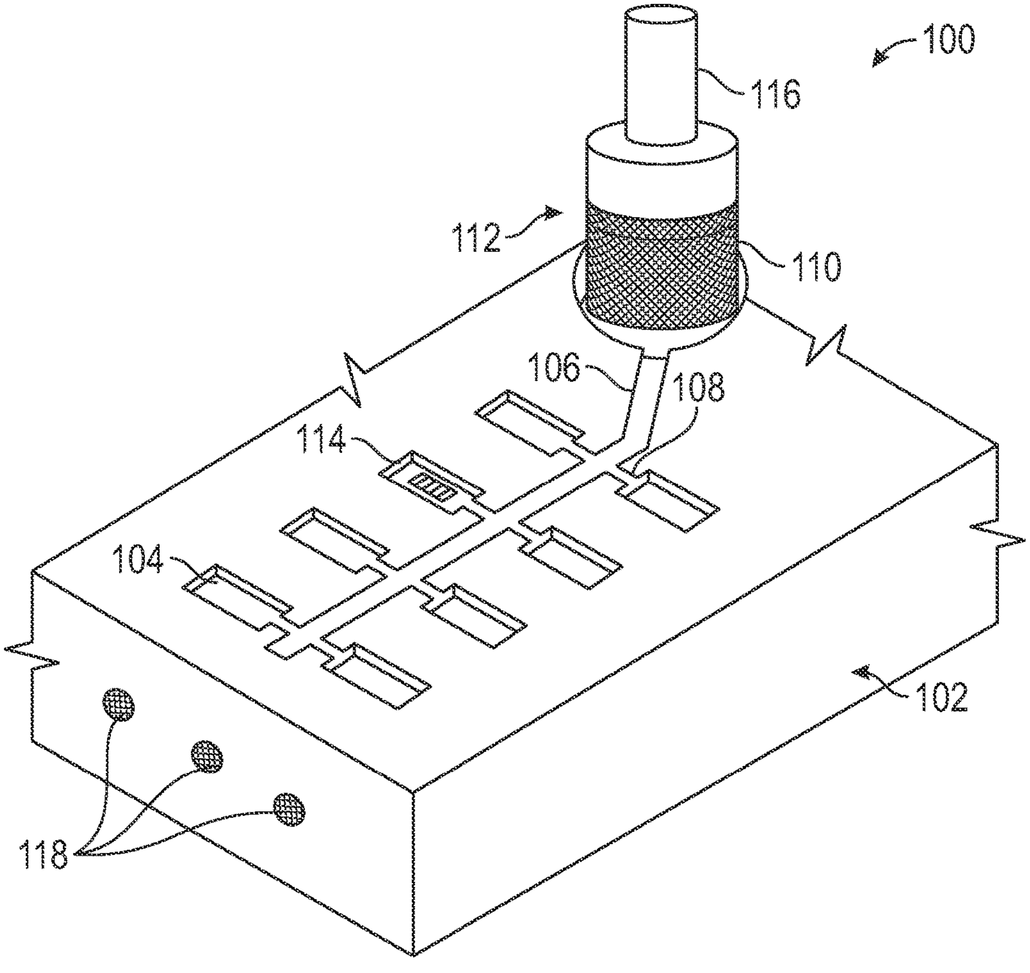
FIG. 2 is a schematic view of a transfer mold for encapsulation of an electronic device.

FIG. 2 depicts a transfer mold 100 in accordance with the disclosure. As shown in FIG. 2, a number of mold cavities 104 have been machined in a lower half mold 102. The mold cavities 104 are connected to each other by a runner 106. A gate 108 may be placed at the joint or channel between the runner 106 and each mold cavity 104. A transfer pot 110 is fluidly connected to the runner 106 and the mold cavities 104. The transfer pot 110 has charge material 112 therein. The charge material 112 must be heated or maintained at a desired viscosity so that it can flow down the runner 106 to the mold cavities 104.

Not shown in FIG. 2 is an upper half mold, which may be a flat plate or may have reciprocal mold cavities 104 formed therein. After placement of the electronic devices 114 in the mold cavities 104 and placement of the upper half mold over the lower half mold 102, a plunger 116 or other pressurizing device may be used to force the charge material 112 from the transfer pot 110, into the runner 106, through the gate 108, and into the mold cavities 104. After cooling, which may be controlled by heating elements 118 in the lower half mold 102, the encapsulated electronic devices 114 can be removed from the lower half mold 102.

Figure 3A:
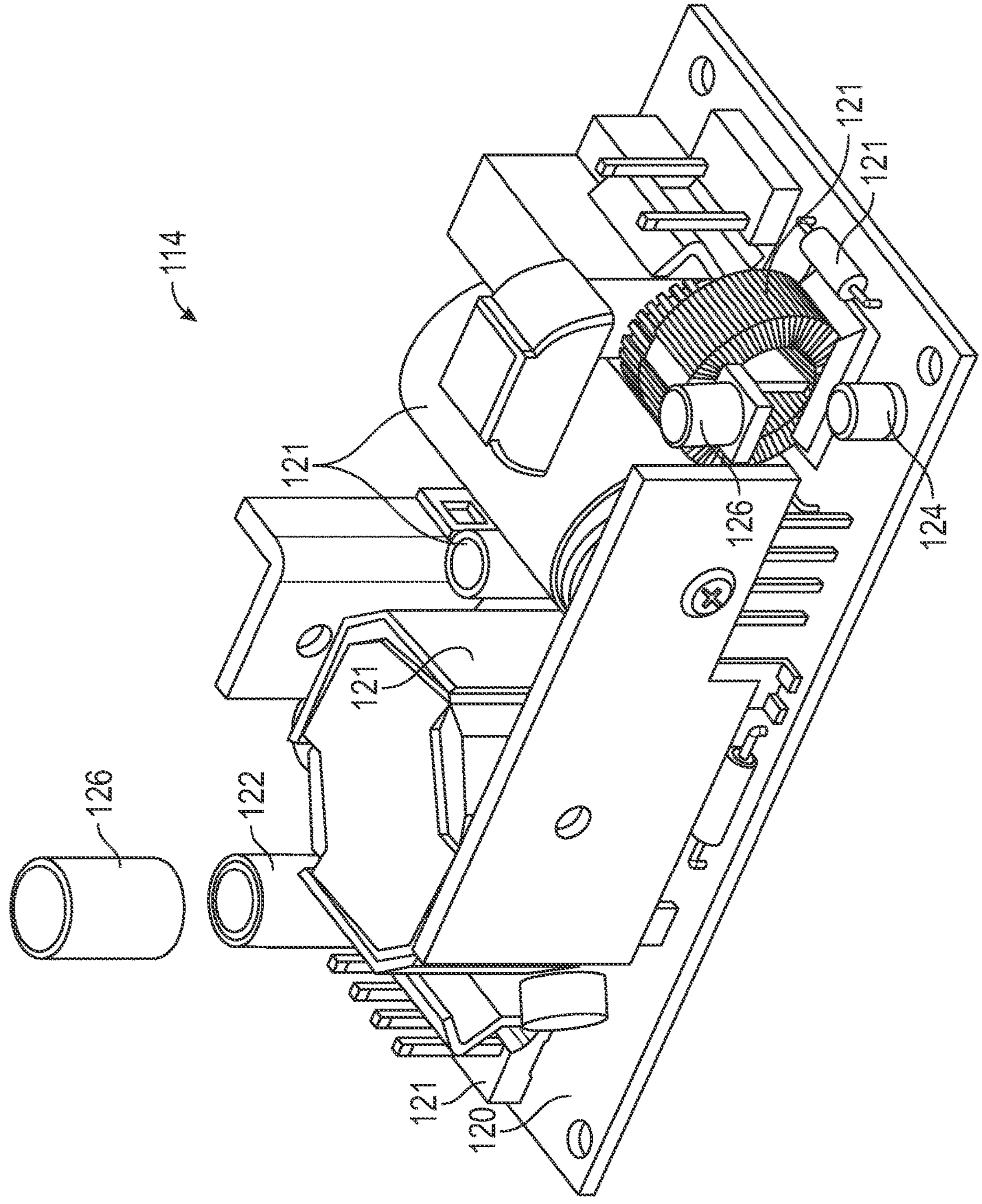
FIG. 3A is a profile view of an electronic device formed by a method of the disclosure.

An example of an electronic device 114 in accordance with the disclosure is found in FIG. 3A. The electronic device 114 includes a printed circuit board (PCB) 120. Electrically connected to the PCB 120 are a variety of electronic components 121. The electrical components may include a sensor 122 and an emitter 124 (e.g., an LED). Other components may also be included on the PCB 120. As an alternative or in addition the PCB may incorporate or be replaced by a metal lead frame, ceramic based or other types of electrical interconnect substrates without departing from the scope of the present disclosure.

Prior to the encapsulation process, one or more covers 126 may be strategically placed over the sensor 122 and emitter 124. These covers 126 may be placed on the PCB 120 and held in place by their fit over the sensor 122 or emitter 124. Alternatively, the covers 126 may be formed of a material enabling soldering of the cover 126 to the PCB 120. For example, the cover 126 may be formed of metal and soldered to the PCB 120 and connected to a ground plane of the PCB 120. This soldering can increase the rigidity of the PCB 120 during the encapsulation process and help to minimize any detrimental effects of the heating of the PCB 120 during the thermal molding process. Similar effects on rigidity can be had using adhesives such as epoxy to adhere the covers 126 to the PCB 120. By using adhesives non-metallic covers 126 may be employed. The covers 126 extend vertically from the PCB 120 to make them the tallest component on the PCB 120. The covers 126 may be formed of any suitable material including metals, polymeric materials, and ceramics, as well as others that can withstand the pressure and temperature of the molding process.

The mold cavity 104 has a height that is greater than or substantially identical to that of the cover 126 and PCB 120 assembly. Accordingly, when the upper half mold is placed on the lower half mold 102, there is a tight tolerance between a top surface of the cover 126 and the upper half mold. In this way, the amount of charge material 112 can be reduced so that only so much as to encapsulate the cover 126 is utilized.

Once the PCB 120 and the electrical components including the sensor 122 and emitter 124 and their covers 126 are encapsulated in the thermoset charge material, the surface of electronic device 114 opposite the PCB 120 may be ground down. Removal (for example by grinding or micro-bead blasting) of thermo molded electronic devices is a common practice to remove any flash, that is, charge material, that is not intended to be part of the final product. Flash may be formed in the seam between the lower half mold 102 and the upper half mold, at the runner gate 108, or in other locations. Grinding this flash is desirable to produce a clean product (i.e., electronic device) for use with other components.

In addition to grinding the flash, grinding of the topmost surface of the encapsulating charge material can be employed to grind away the charge material covering the upper surface of the cover 126. Typical grinding may remove as little as 2-5 micrometers of the encapsulating charge material as well as the top surface of the cover 126. By grinding away the upper surface of the cover 126, a via is formed in the encapsulating charge material that exposes the underlying sensor 122 or emitter 124 allowing both of them to interact with the environment and operate as intended. As will be appreciated, in an effort to minimize the amount of ground charge material that might enter the cover 126 and land on the sensor 122 or emitter 124, the grinding process may be undertaken with the encapsulated electronic device 114 inverted or turned upside down. In this position, any material produced by the grinding process should fall away from the sensor 122 or emitter 124. Vacuuming, washing, air blasting, and/or other cleaning methods may also be incorporated into the process of manufacturing the electronic device.

Figure 3B:
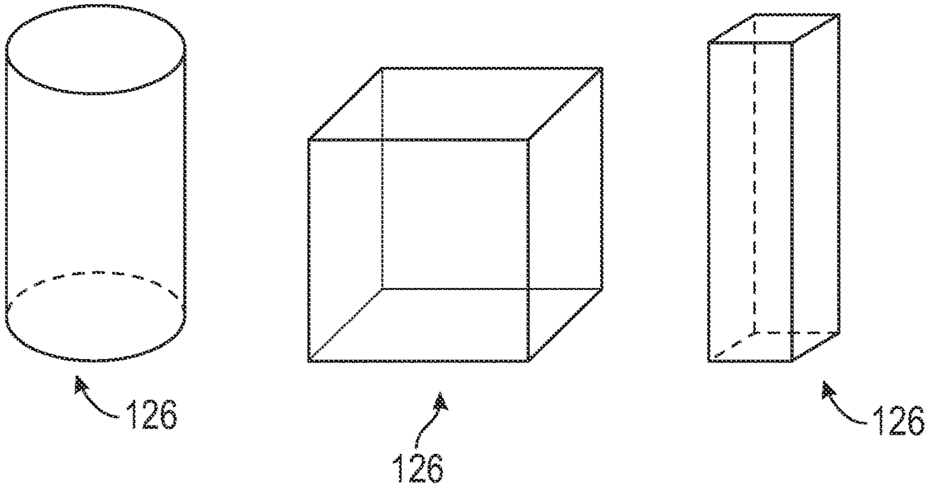
FIG. 3B depicts various forms of the cover of the disclosure.

The cover 126 may be any shape to conform to the outer periphery of the sensor 122 or emitter 124. Thus, the cover 126 may be round cylindrical, or a combination of round and square cylindrical as shown in FIG. 3A; but they may also be square, rectangular, or another shaped cylinder. FIG. 3B shows a variety of shapes and sizes of the covers 126. The cover 126 is generally shaped to fit securely over the sensor 122 or emitter 124, though it may also be desirable that the cover defines a larger volume and creates a void proximate the sensor 122 or emitter 124. This may be useful, for example, where the sensor is a wide-angle camera lens, and there is need of a larger unimpeded field of view free from the inner side wall of the cover 126 and the encapsulating charge material.

The cover 126 is generally formed so that it is only open on the side of the cover 126 that will be placed over the sensor 122 or emitter 124. That is, in the case of a cylindrical cover 126, as shown in FIG. 3A, the cover 126 has a top surface and sidewalls but no bottom surface. It is also possible that the cover is formed of just sidewalls and has no top or bottom. In such instances, the disclosure relies on the close tolerance of the upper half mold to effectively prevent any charge material from entering the cover 126. Any flash that enters the cover 126 via the interface of the cover 126 and the upper half mold can be removed after the charge material has cooled.

As noted above, the cover 126 may be soldered directly to the PCB 120 and electrically connected to a ground plane (not shown). In such cases, the covers 126 may be formed of a metal material suitable for soldering to the PCB 120 and particularly electrical leads formed on the PCB 120. Alternatively, the covers may be made from a suitable plastic material and either placed over the sensor 122 or emitter 124 or adhered to the PCB 120 with an adhesive.

In a further embodiment, rather than extending all the way to the PCB 120, the cover 126 may sit on a top surface of a sensor 122 or emitter 124. The cover 126 may be adhered to a perimeter of the sensor 122 or emitter 124.

As noted above, it is generally desirable that the cover be the tallest component on the PCB 120. This allows the grinding process to remove the portion of the cover 126 and allow exposure of the sensor 122 or emitter 124. However, this need not always be the case. In some embodiments, rather than a grinding process, a milling process may be employed. As is well known, precision milling machines with computer numeric control (CNC) enable highly accurate milling of components at high speeds. By employing such techniques, an encapsulated electronic device 114 may utilize covers 126 that are of a height less than the tallest other component on the PCB 120. An example of this can be seen in FIG. 3A with the cover 126 to be placed over the emitter 124. The covers 126 will still have a height dimension taller than the sensor 122 or emitter 124, to allow for a space between the depth of machining of the milling process and the surface of the sensor 122 or emitter 124. By milling the cover 126 and removing the top surface thereof, the sensor 122 or emitter 124 is exposed to the environment and allowed to function as intended, unimpeded by the encapsulating charge material. By utilizing these shorter covers 126, the overall dimensions of the encapsulated electronic device 114 may be reduced, which can be particularly beneficial for certain applications such as consumer devices (e.g., smart watches, etc.) that employ one or more sensors 122 or emitters 124 but have a slim profile. Other methods of accessing the encapsulated sensor 122 or emitter 124 can include laser drilling and other mechanical or chemical methods (e.g., chemical etching) known to those of skill in the art.

Figure 4:
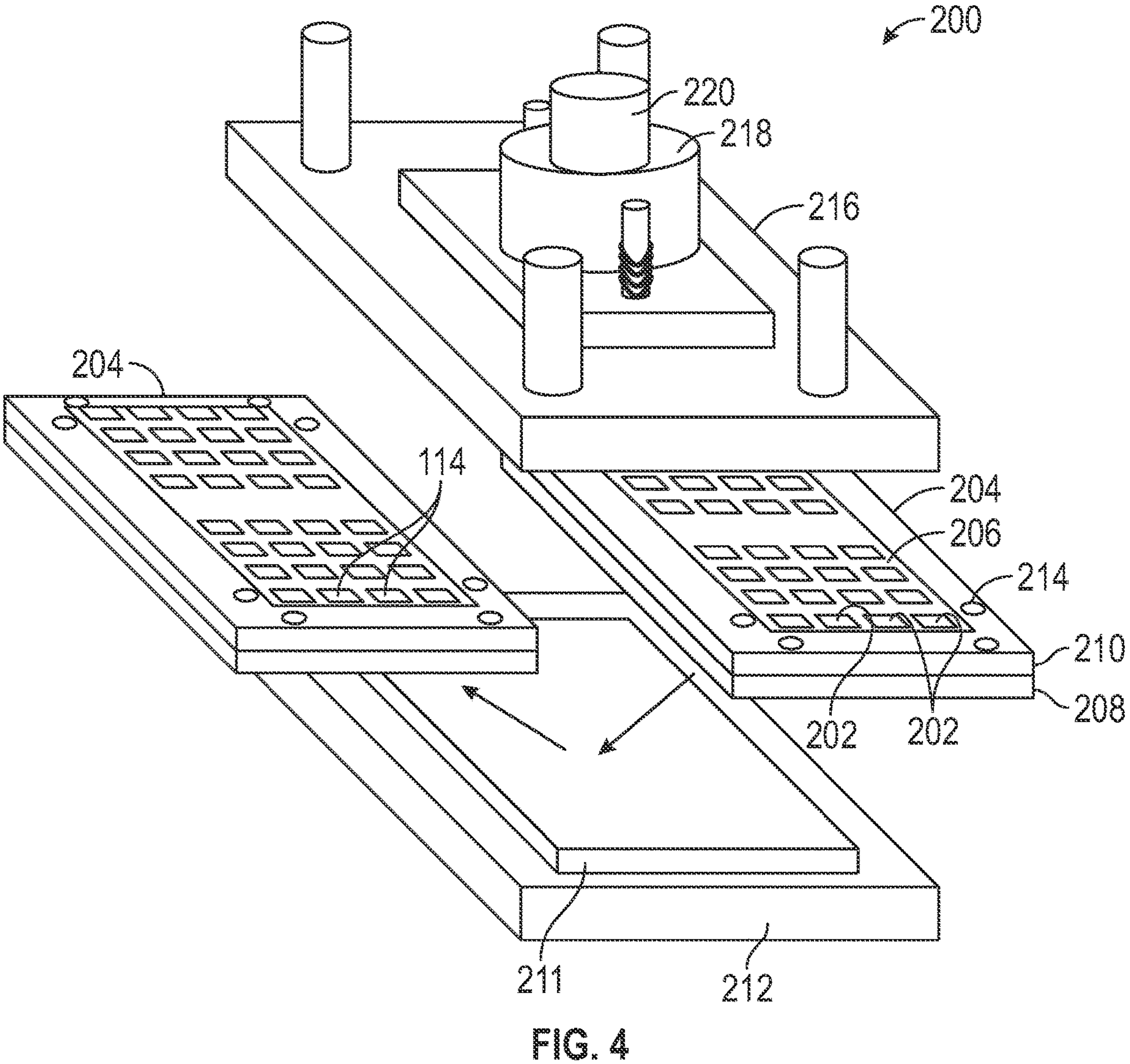
FIG. 4 is a schematic view of a transfer mold for encapsulation of an electronic device.

FIG. 4 depicts another transfer mold 200. In the transfer mold 200, rather than have mold cavities formed in one of the mold halves, the mold cavities 202 are formed in an aperture plate assembly 204. The aperture plate assembly 204 may be formed of three components: a removable cavity plate 206, a lower indexing plate 208, and an upper indexing plate 210. The removable cavity plate 206 defines the cavities in which the electronic devices 114 will be placed for encapsulation. The lower indexing plate 208 includes a recess formed on a bottom surface thereof to match a projection 211 extending from a lower half mold 212. The lower indexing plate 208 also may form the bottom surface of the cavities defined by the removable cavity plate 206. The upper indexing plate 210 secures the removable cavity plate 206 to the lower indexing plate 208 and is machined such that a uniform flatness is achieved. The upper indexing plate 210 includes indexing holes 214 to index the upper indexing plate 210, and the removable cavity plate 206 and lower indexing plate 208, to the upper half mold 216. In this fashion, by using of the projection 211 in the lower half mold 212 and the indexing holes 214, which align the upper indexing plate 210 with the upper half mold 216, the entire system is indexed or aligned, thus ensuring proper placement of the cavities.

The cavities are in fluid communication with the transfer pot 218 and the charge material included therein. The plunger 220 acts on the transfer pot 218 to push the charge material out of the transfer pot 218 and into the cavities in the removable cavity plate 206. FIG. 4 shows the aperture plate assembly 204 with the electronic devices 114 placed in the cavities both before encapsulation and after encapsulation. After encapsulation, the electronic devices 114 can be removed from the aperture plate assembly 204 and ground or milled as described herein above. Additional processing, such as singulation (where individual electronic devices 114 are separated from one another), grinding, polishing, flash removal, milling, and the like may be undertaken following removal from the transfer mold 200.

Figure 5:
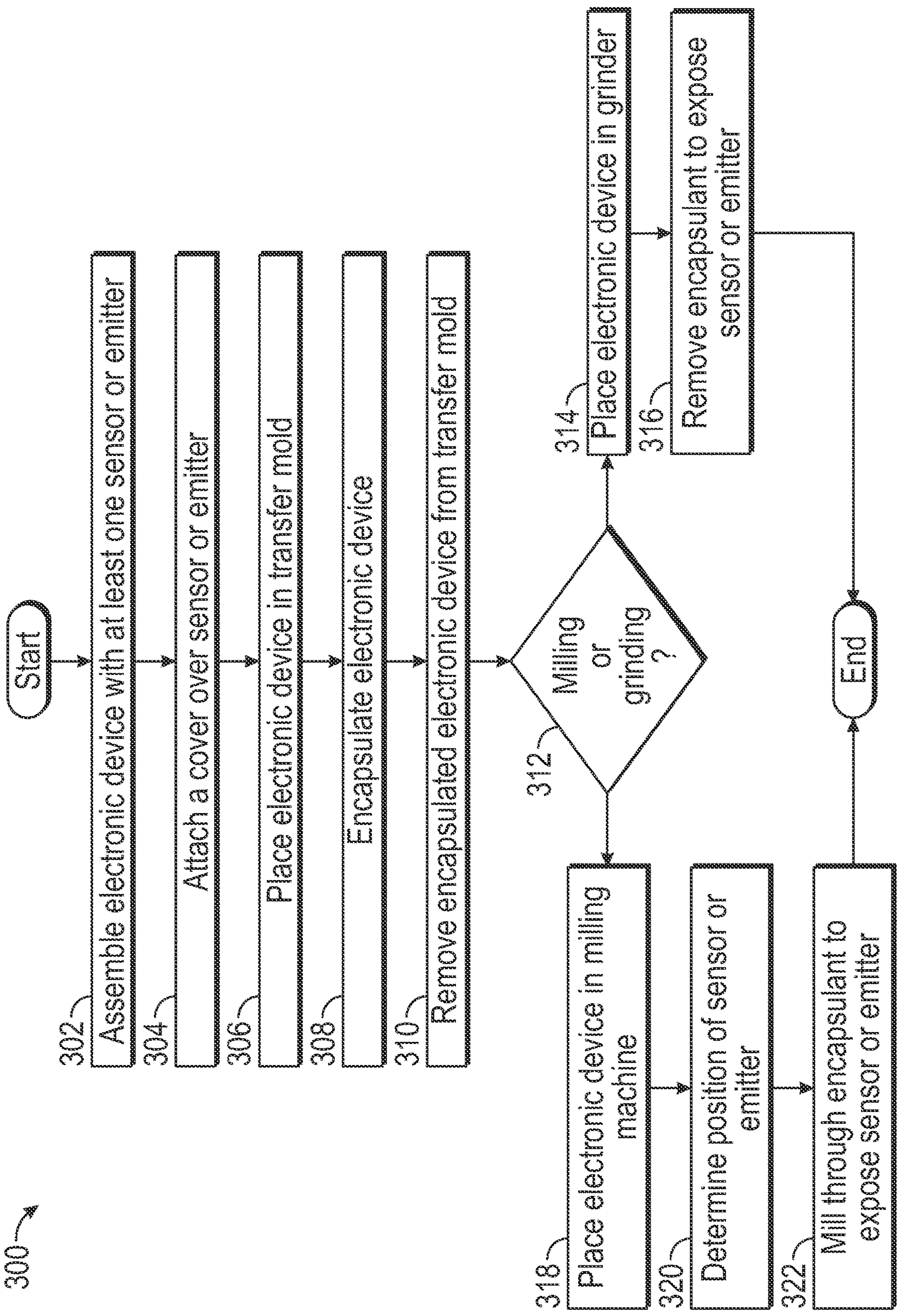
FIG. 5 is a flow chart detailing a method of forming an encapsulated electronic device including a sensor or emitter in accordance with the disclosure.

FIG. 5 is a flow chart detailing a process 300 of transfer molding an electronic device 114 including at least one sensor 122 or emitter 124. Process 300 starts at step 302 with the assembly of an electronic device that includes at least one sensor 122 or an emitter 124. This assembly can be performed by any known methodology and typically involves one or more steps of soldering electronic components (e.g., relays, resistors, coils, potentiometers, capacitors, transistors, switches, memory (EEPROM, RAM), processors) to a PCB 120, resulting in the electronic device 114 depicted in FIG. 3.

At step 304, one or more covers 126 are attached to the PCB 120. The cover 126 may be soldered to the PCB 120 or a portion of the sensor 122 or emitter 124. Alternatively, the cover 126 may be placed on or over the sensor 122 or emitter 124. Still further, the cover 126 may be adhered to the PCB 120 on or over the sensor 122 or emitter 124.

Once the cover 126 is attached or placed to protect the sensor 122 or emitter 124, at step 306, the electronic device 114 may be placed in the transfer mold (100, 200) and particularly in a cavity 104. Following placement, at step 308 the transfer mold may be closed, the charge material heated to the desired temperature or viscosity in the transfer pot 110, and a plunger or other force inducing device is employed to force the charge material from the transfer pot 110 to the cavities 104 to encapsulate the electronic devices 114.

Once encapsulated, the electronic devices 114 may be removed from the transfer mold at step 310. The electronic devices 114 may be individualized in the transfer mold or they may be removed as an interconnected batch of electronic devices requiring singulation. Singulation may occur either immediately after removal from the mold, or singulation can be performed as one of the last steps of the process 300, after the sensor 122 or emitter 124 is exposed by one of the processes described herein below.

Following removal from the mold, at step 312, a determination is made as to whether the sensor 122 or emitter 124 is to be exposed via grinding or via milling (both of which are described above). If the electronic device 114 is to be ground, at step 314, the electronic device 114 is placed in a grinding apparatus. The grinding apparatus may be a sander (e.g., a belt-type sander) arranged to remove a desired depth of encapsulating charge material. The grinder is arranged to remove between 2-5 microns and 2-5 mm of encapsulating charge material from the electronic device 114 at step 316. These depths are sufficient to remove both the encapsulating charge material as well as a top portion of the cover 126 and to expose the sensor 122 or emitter 124 to the environment.

Alternatively, if at step 312 the process 300 determines that the electronic device 114 is to be milled, the process 300 proceeds to step 318 where the electronic device 114 is placed in a milling machine. As noted above, this may be a CNC milling machine enabling precise machining of the encapsulating charge material. To enable the precise milling, it may be necessary to register the electronic device 114 to the coordinate system of the milling machine to identify where on the electronic device the sensor 122 or emitter 124 are located so that the milling tools can be accurately driven to the coordinates of the identified location. This may be performed, for example, by loading machine control instructions (e.g., G-code), which are based on the schematic of the electronic device, into a memory, e.g., controller memory, of the CNC milling machine.

Registration points may be identified in the schematics and may be outwardly visible on the electronic device 114. By driving the CNC machine to the registration points, an accurate registration of the position of all the components on the electronic device 114 in the coordinate system of the CNC milling machine may be determined. This registration and the determination of the positions of the sensor 122 or emitter 124 on the electronic device 114 is performed at step 320. Once the locations are accurately determined and the electronic device 114 is registered to the coordinate system of the milling machine, the milling machine may be driven to the locations of the sensor 122 or the emitter 124 and vias may be milled into the electronic device 114 and particularly the cover 126 to expose the sensor 122 or emitter 124 at step 322.

Although embodiments have been described in detail with reference to the accompanying drawings for the purpose of illustration and description, it is to be understood that the inventive processes and apparatus are not to be construed as limited. It will be apparent to those of ordinary skill in the art that various modifications to the foregoing embodiments may be made without departing from the scope of the disclosure. For example, various steps of the methods described herein may be implemented concurrently and/or in an order different from the example order(s) described herein.

The invention claimed is:

1. A method comprising:
- assembling at least one electronic device with a sensor or an emitter;
- placing a cover over the sensor or the emitter;
- placing the electronic device into a mold cavity of a transfer mold, wherein the mold cavity has a height substantially identical to a height of the cover;
- encapsulating the electronic device with an encapsulant, yielding an encapsulated electronic device;
- removing the encapsulated electronic device from the transfer mold;
- placing the encapsulated electronic device in a milling machine;
- determining a position of the sensor or the emitter; and
- milling a top portion of the cover to expose the sensor or the emitter based on the position of the sensor or the emitter.

2. The method of claim 1, wherein the electronic device includes a printed circuit board.

3. The method of claim 2, wherein placing the cover includes soldering the cover to the printed circuit board.

4. The method of claim 2, wherein placing the cover includes adhering the cover to the printed circuit board.

5. The method of claim 2, wherein the cover does not extend to a printed circuit board.

6. The method of claim 1, wherein the encapsulant is a charge material.

7. The method of claim 1, wherein milling includes milling material across an entirety of a surface of the encapsulated electronic device.

8. The method of claim 1, further comprising vacuuming milling debris from a surface of the emitter or the sensor.

9. The method of claim 1, further comprising registering the position of the sensor or the emitter with a coordinate system of the milling machine.

10. The method of claim 1, further comprising singulating the encapsulated electronic device from encapsulated electronic devices.

11. A method comprising:
- assembling at least one electronic device with a sensor or an emitter;
- attaching a cover over the sensor or the emitter;
- placing the electronic device into a mold cavity of a transfer mold, wherein the mold cavity has a height substantially identical to a height of the cover;
- encapsulating the electronic device with an encapsulant, yielding an encapsulated electronic device;
- removing the encapsulated electronic device from the transfer mold;
- placing the encapsulated electronic device in a grinder; and
- grinding a top portion of the cover to expose the sensor or the emitter.

12. The method of claim 11, further comprising grinding flash material from the encapsulated electronic device.

13. The method of claim 11, wherein grinding includes grinding material across an entirety of a surface of the encapsulated electronic device.

14. The method of claim 11, further comprising inverting the electronic device prior to grinding, such that grinding debris falls away from a surface of the sensor or the emitter.

15. The method of claim 11, wherein the cover is formed of a tube or a hollow shape.

16. The method of claim 15, wherein the tube or the hollow shape has no top or bottom.

17. A method comprising:
- placing a cover over a sensor or an emitter of an electronic device;
- placing the electronic device, including the cover, into a transfer mold system;
- encapsulating the electronic device with an encapsulant, yielding an encapsulated electronic device; and
- removing material across an entire surface of the encapsulated electronic device until a top portion of the cover is removed to expose the sensor or the emitter.

18. The method of claim 17, further comprising grinding the entire surface of the encapsulated electronic device to remove the top portion of the cover.

19. The method of claim 17, further comprising milling the encapsulated electronic device at known locations of the sensor or the emitter to expose the sensor or the emitter.

20. The method of claim 1, wherein placing the cover includes fitting the cover over the sensor or the emitter such that the cover is held in place by the cover's fit over the sensor or the emitter.

* * * * *